United States Patent
Zhang et al.

(10) Patent No.: US 9,583,366 B2
(45) Date of Patent: Feb. 28, 2017

(54) THERMALLY-ENHANCED PROVISION OF UNDERFILL TO ELECTRONIC DEVICES USING A STENCIL

(71) Applicant: ASM TECHNOLOGY SINGAPORE PTE LTD, Singapore (SG)

(72) Inventors: Qinglong Zhang, Tsuen Wan (HK); John Hon Shing Lau, Palo Alto, CA (US); Ming Li, Kwai Chung (HK); Michael Zahn, Singapore (SG); Yiu Ming Cheung, Kowloon (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 10 days.

(21) Appl. No.: 14/659,172

(22) Filed: Mar. 16, 2015

(65) Prior Publication Data

US 2016/0276177 A1    Sep. 22, 2016

(51) Int. Cl.
*H01L 21/56* (2006.01)
*H01L 25/00* (2006.01)
*H01L 23/00* (2006.01)
*H01L 25/065* (2006.01)

(52) U.S. Cl.
CPC .......... *H01L 21/563* (2013.01); *H01L 21/561* (2013.01); *H01L 21/565* (2013.01); *H01L 24/75* (2013.01); *H01L 24/83* (2013.01); *H01L 25/50* (2013.01); *H01L 24/16* (2013.01); *H01L 24/32* (2013.01); *H01L 24/73* (2013.01); *H01L 24/92* (2013.01); *H01L 25/0655* (2013.01); *H01L 2224/16227* (2013.01); *H01L 2224/73204* (2013.01); *H01L 2224/92125* (2013.01); *H01L 2924/14* (2013.01); *H01L 2924/157* (2013.01); *H01L 2924/1579* (2013.01); *H01L 2924/15786* (2013.01); *H01L 2924/3511* (2013.01)

(58) Field of Classification Search
CPC ..... H01L 21/563; H01L 21/565; H01L 25/50; H01L 21/561; H01L 21/56
See application file for complete search history.

(56) References Cited

U.S. PATENT DOCUMENTS

| | | | |
|---|---|---|---|
| 2003/0042617 A1* | 3/2003 | Lee | H01L 21/563 257/778 |
| 2003/0116347 A1* | 6/2003 | Kubo | C08G 59/5033 174/260 |
| 2010/0181680 A1* | 7/2010 | Harada | H01L 21/563 257/773 |

* cited by examiner

*Primary Examiner* — Selim Ahmed
(74) *Attorney, Agent, or Firm* — Ostrolenk Faber LLP

(57) ABSTRACT

A method of feeding underfill material to fill a space between a semiconductor die and a substrate onto which the semiconductor die has been bonded, the method comprises positioning a stencil over the semiconductor die. The stencil has an elongated slot extending adjacent to an edge of the semiconductor die. Underfill material is printed through the slot such that the underfill material falls through the slot onto the substrate next to the edge of the semiconductor die. Thereafter, the underfill material is heated such that the underfill material flows across the space between the semiconductor die and the substrate from the edge of the semiconductor die to an opposite edge thereof through capillary action.

16 Claims, 3 Drawing Sheets phpThermally-ENHANCED PROVISION OF
UNDERFILL TO ELECTRONIC DEVICES
USING A STENCIL

FIELD OF THE INVENTION

The invention relates to the assembly and packaging of electronic devices, and in particular to the provision of underfill to fill spaces between semiconductor dice and substrates of electronic devices.

BACKGROUND AND PRIOR ART

Flip chip packages are formed by solder joints arranged in a grid pattern on one side of an integrated circuit or semiconductor die to conduct electrical signals between the semiconductor die and a substrate such as a printed circuit board (PCB) onto which it is mounted. Each solder joint comprises a pad with a bump of solder adhered to it, and these solder bumps are usually held in place with a tacky flux.

The semiconductor die is mounted onto a PCB substrate with conductive pads in a pattern that matches the grid pattern of the solder bumps. The assembly is then heated, typically in a reflow oven, to melt the solder bumps. Surface tension causes the molten solder to hold the package in alignment with the PCB at the correct separation distance while the solder cools and solidifies, forming soldered connections between the semiconductor die and the PCB.

A disadvantage of flip chip packages is that the solder bumps are not mechanically compliant like the leads of traditional lead frame packages. Therefore, bending due to differences in coefficient of thermal expansion between PCB substrates and semiconductor dice causes thermal stress, while flexing and vibration cause mechanical stress, which can cause the solder joints to fracture.

Such thermal or mechanical stress issues can be overcome by bonding the semiconductor die to the PCB substrate in a process called underfilling, in which an electrically-insulating adhesive such as an epoxy mixture is infused under the semiconductor die after it has been soldered to the PCB substrate. This effectively glues the semiconductor die to the PCB substrate. Moreover, the underfill is useful for reducing the effects of any thermal stress experienced by the solder joints by distributing the thermal expansion mismatch between the semiconductor die and the PCB substrate, preventing stress concentration in the solder joints which would lead to premature failure. An additional advantage of injecting underfill is that it limits tin whisker growth. There are several types of underfill materials in use with differing properties relative to workability and thermal transfer.

There are basically two approaches to post-assembly underfilling, namely capillary underfill (CUF) and molded underfill (MUF).

CUF is the most common approach used for volume production. In CUF, the underfill is dispensed by a needle or jet from one or two sides of the semiconductor die that has been bonded onto a PCB substrate. With the assistance of capillary action, the underfill completely fills the narrow space around the solder joints between the semiconductor die and the PCB substrate. The semiconductor die and the substrate are then firmly bonded by curing the underfill. However, since CUF is typically performed one semiconductor die at a time, low throughput is a major disadvantage.

For MUF, a modified epoxy molding compound (EMC) is used to mold the chip and to fill the space between the semiconductor die and the substrate. The encapsulant of the semiconductor die and the underfill are formed at the same time, which helps to increase the throughput using this process. However, there are various challenges to using MUF. For instance, the flow of MUF in-between the semiconductor dies and the substrate should preferably be assisted by vacuum to improve the reliability of the process. Next, the modified EMC should have silica fillers with very small sizes to ensure that it is of sufficiently low viscosity to fill the narrow space.

Furthermore, warpage of the package is a potential issue due to the material properties of EMC and the molding temperature is limited by the melting point of the solder joints. As a result, the standoff heights and pitches of the solder joints have to be relatively large to overcome the aforesaid disadvantages.

SUMMARY OF THE INVENTION

It is thus an object of the invention to seek to provide a post-assembly underfill printing approach which increases throughput while avoiding the drawbacks involved in the use of molded underfill.

According to a first aspect of the invention, there is provided a method of feeding underfill material to fill a space between a semiconductor die and a substrate onto which the semiconductor die has been bonded, the method comprising the steps of: positioning a stencil over the semiconductor die, the stencil having an elongated slot extending adjacent to an edge of the semiconductor die; printing the underfill material through the slot such that the underfill material falls through the slot onto the substrate next to the edge of the semiconductor die; and thereafter heating the underfill material such that the underfill material flows across the space between the semiconductor die and the substrate from the edge of the semiconductor die to an opposite edge thereof through capillary action.

According to a second aspect of the invention, there is provided a method of feeding underfill material to fill spaces between a plurality of semiconductor dice and a substrate onto which the plurality of semiconductor dice have been bonded, the method comprising the steps of: positioning a stencil over the semiconductor dice, the stencil having a plurality of elongated slots, each elongated slot extending adjacent to an edge of each one of the semiconductor dice; printing the underfill material through the slots such that the underfill material falls through the slots onto the substrate next to the edges of the semiconductor dice; and thereafter heating the underfill material such that the underfill material flows across the spaces between the semiconductor dice and the substrate from the edge of each semiconductor die to an opposite edge thereof through capillary action.

According to a third aspect of the invention, there is provided a method of manufacturing an integrated circuit package, comprising the steps of: bonding a semiconductor die onto a substrate; positioning a stencil over the semiconductor die, the stencil having an elongated slot extending adjacent to an edge of the semiconductor die; printing the underfill material through the slot such that the underfill material falls through the slot onto the substrate next to the edge of the semiconductor die; and thereafter heating the underfill material such that the underfill material flows across a space between the semiconductor die and the substrate from the edge of the semiconductor die to an opposite edge thereof through capillary action to form an underfill.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An example of an underfilling approach in accordance with the invention will now be described with reference to the accompanying drawings, in which.

DETAILED DESCRIPTION OF THE PREFERRED EMBODIMENT OF THE INVENTION

Figure 1:
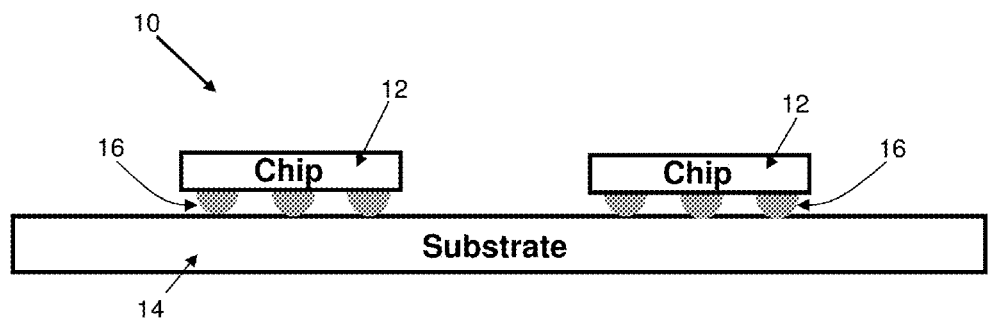
FIG. 1 is a cross-sectional view of a substrate assembly including semiconductor dice that have been bonded to a substrate by way of solder joints.

FIG. 1 is a cross-sectional view of a substrate assembly 10 including semiconductor dice 12 that have been bonded to a substrate 14 by way of solder joints 16. Solder bumps that have been formed on electrodes of the semiconductor dice 12 have been melted and placed onto corresponding bond pads on the substrates by a flip-chip process. The solder balls harden when cooled to form the solder joints for electrical interconnection. The dimensions of the semiconductor die may be about 5 mm×5 mm×150 µm and the solder joints may comprise copper pillars and tin-silver solder cap bumps which are separated by pitches of about 160 µm. A diameter of each copper pillar may be 40 µm and its height may be 25 µm, while each tin-silver solder cap may have a diameter of 17 µm. Furthermore, the substrate 14 may comprise a silicon wafer or organic panel substrate. As explained above, it would be beneficial to insert underfill material into the space between each semiconductor die 12 and the substrate 14.

Figure 2:
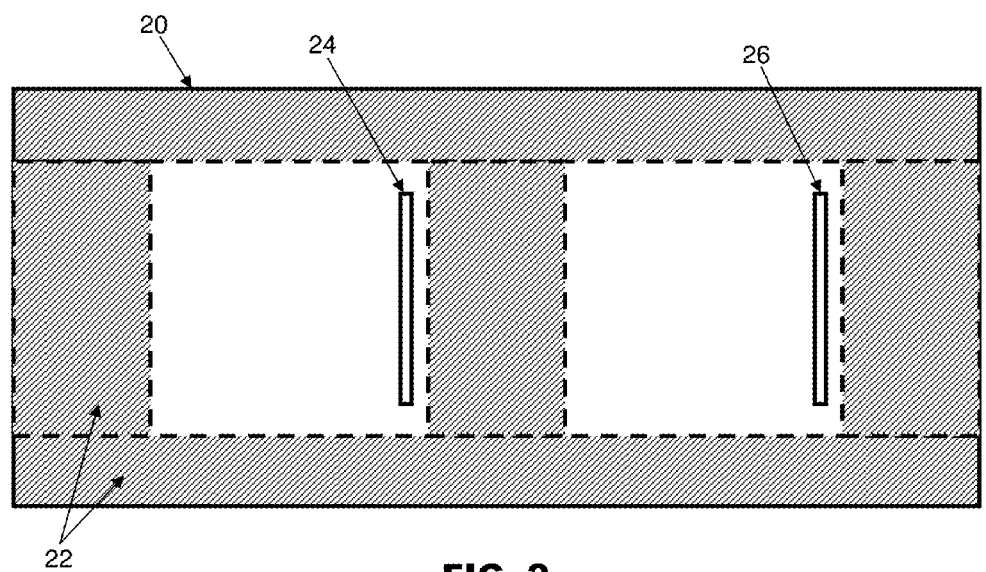
FIG. 2 is a plan view of a stencil that is suitable for printing underfill material onto the substrate assembly of FIG. 1.

FIG. 2 is a plan view of a stencil 20 that is suitable for printing underfill material onto the substrate assembly of FIG. 1 so as to feed underfill material to fill the space between the semiconductor die 12 and the substrate 14. Illustrated on the stencil 20 is an offset layer that may be formed from regions of dry film 22 that are adhered onto the stencil 20, such that there are multiple rectangular openings in the stencil 20 that are surrounded by dry film 22. Each rectangular opening is sized to enclose one semiconductor die 12 and is slightly larger than the semiconductor die 12. The stencil 20 is positioned to cover multiple semiconductor dice 12 to be adapted for supplying underfill material comprising epoxy to all the semiconductor dice 12 at once.

The stencil 20 further comprises stencil openings 24, 26 that are in the form of narrow elongated slots that are located adjacent to only one edge of each of the respective semiconductor dice 12. Each stencil opening 24, 26 is designed for printing underfill material next to one semiconductor die 12, so that underfill material that is printed through the stencil openings 24, 26 fall and land onto the substrate 14 next to each semiconductor die 12. The narrow stencil openings 24, 26 are designed such that underfill material is only printed adjacent to one edge of each semiconductor die 12 and this reduces the amount of underfill material required.

According to one embodiment of the invention, the stencil thickness is 100 µm and the size of each stencil opening 24, 26 is 5.5 mm×0.8 mm. The thickness of the offset layer comprising the layer of dry film 22 adhered to the stencil is 250 µm. Each dry film opening on the stencil 20 has a size of 11 mm×12 mm.

The layer of dry film 22 (which may comprise photoresist) is laminated on the stencil 20 with a heater roller at a temperature of about 125° C. The opening of the dry film 22 is then formed with an ultraviolet exposure machine as well as an appropriate chemical solution to remove the required amount of excess photoresist. The printing process will be described further below.

Figure 3:
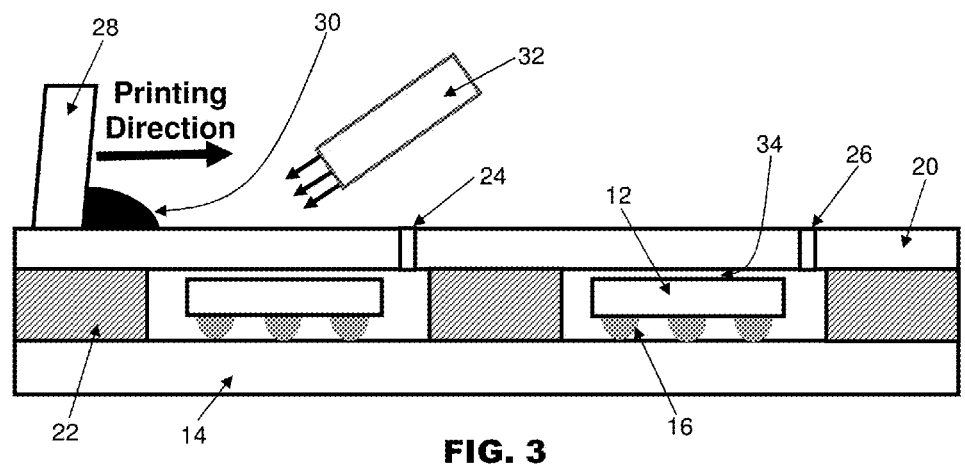
FIG. 3 is a cross-sectional view of the stencil positioned over the substrate assembly, and a squeegee pushing underfill material over a top surface of the stencil.

FIG. 3 is a cross-sectional view of the stencil 20 positioned over the semiconductor die 12 comprised in the substrate assembly 10 and a squeegee 28 pushing underfill material 30 over a top surface of the stencil 20.

In the illustration, the squeegee 28 pushes the underfill material 30 in a printing direction from the left to the right of the drawing to print the underfill material 30 through the stencil openings 24, 26.

A bottom surface of the stencil 20 is generally resting on the layer of dry film 22 that is adhered onto the bottom surface of the stencil 20, and the layer of dry film 22 rests in turn on the substrate 14. Areas of the stencil 20 where the semiconductor dice 12 are located are not covered by the dry film 22. A height of the stencil 20 is controlled such that a gap 34 is present between a top surface of each semiconductor die 12 and the bottom surface of the stencil 20. The height of the stencil 20 is in turn determined by the layer of dry film 22, which should be of a sufficient thickness so as to form the gap 34 when the layer of dry film 22 is resting on the substrate 14.

The size of the stencil openings 24, 26 and the thickness of the dry film 22 may determine a volume of the underfill material 30 that is dispensed. The volume of underfill material 30 that is required and which is printed with respect to each semiconductor die 12 is controlled such that it is approximately equal to the space between the semiconductor die 12, solder joints 16 and the substrate 14, including fillet on the four sides of the semiconductor die 12.

In order to lower the viscosity of the underfill material 30 when it is being printed through the stencil openings 24, 26, a hot air blower 32 is positioned in front of the printing direction of the squeegee 28 to heat the underfill material 30 by generating a supply of hot air onto the stencil 20, squeegee 28 and underfill material 30 in order to keep the underfill material 30 substantially fluid.

Figure 4:
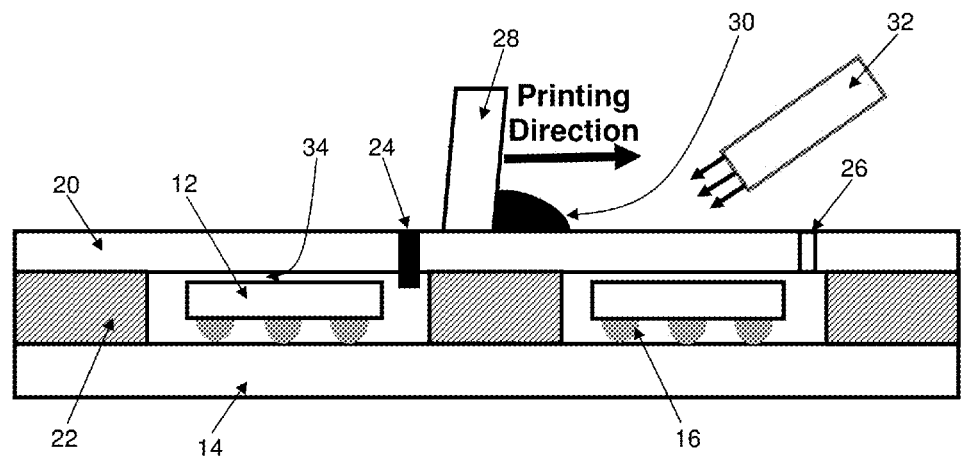
FIG. 4 is a cross-sectional view of the squeegee which has passed a first stencil opening to fill it with underfill material.

FIG. 4 is a cross-sectional view of the squeegee 28 which has passed a first stencil opening 24 to fill it with underfill material 30. The underfill material 30 which is collected in the stencil opening 24 will flow and fall onto the substrate 14 between one edge of the semiconductor die 12 and the dry film 22. Meanwhile, the hot air blower 32 is movable along with the movement of the squeegee 28 in order to maintain a supply of hot air onto the underfill material 30 and to keep it substantially fluid as the squeegee 28 moves across the top surface of the stencil 20.

The printing speed of the squeegee 28 may be between 150 and 290 mm/s, the printing force may be 8 kg, and the snap-off height may be zero.

Figure 5:
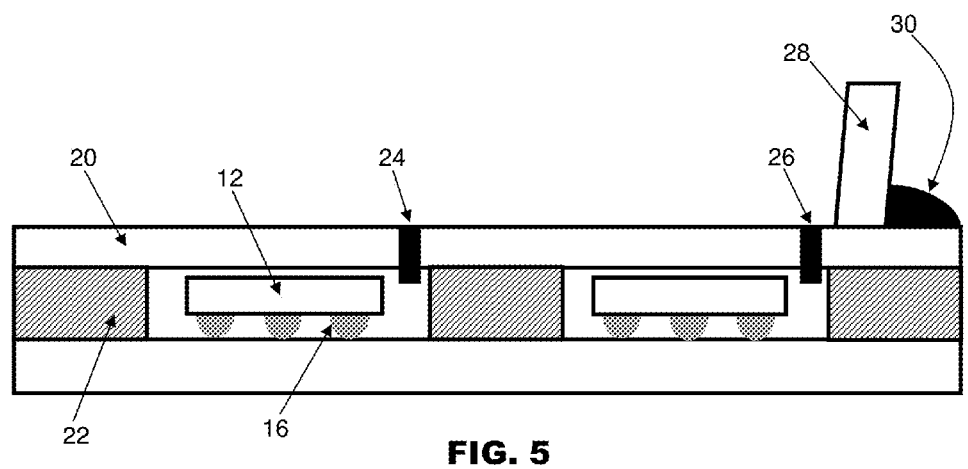
FIG. 5 is a cross-sectional view of the squeegee which has passed a second stencil opening to also fill the second stencil opening with underfill material.

FIG. 5 is a cross-sectional view of the squeegee 28 which has passed the second stencil opening 26 to also fill the second stencil opening 26 with underfill material 30. The underfill material 30 collected in the second stencil opening 26 will flow and fall onto the substrate 14 next to the semiconductor die 12. The printing of all the required underfill material 30 onto the substrate 14 in respect of all the semiconductor dice 12 on the substrate 14 would usually take only a few seconds, depending on the printing speed.

Figure 6:
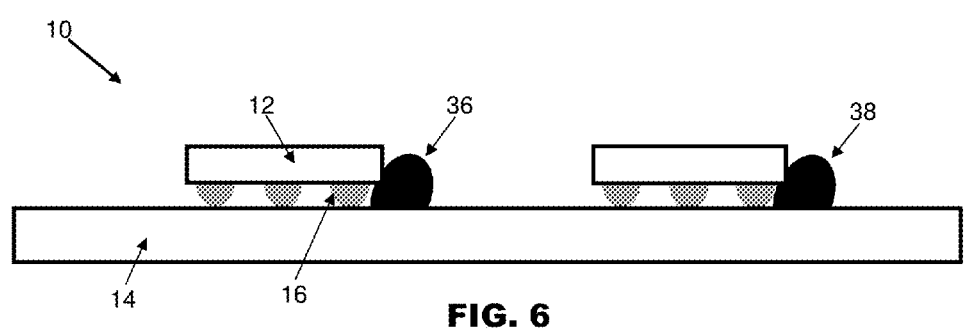
FIG. 6 is a cross-sectional view of the substrate assembly showing underfill material printed next to a space between the semiconductor die and the substrate.

FIG. 6 is a cross-sectional view of the substrate assembly 10 showing underfill material 30 printed next to a space between the semiconductor die 12 and the substrate 14. After the underfill material 30 has been printed, the stencil 20 is removed from the substrate 14, and the substrate assembly 10 can now be transferred away from the printing area. There is a first underfill bead 36 next to and in contact with one semiconductor die 12 and a second underfill bead 38 next to and in contact with another semiconductor die 12.

Figure 7:
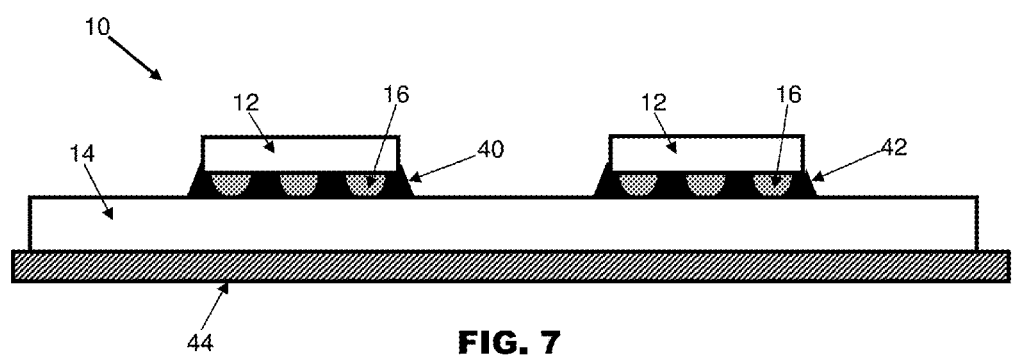
FIG. 7 is a cross-sectional view of underfill material having spread out to fill the spaces between the semiconductor dice and the substrate.

Thereafter, the substrate assembly 10 is placed onto a hot plate 44, which is typically heated to a temperature of more than 100° C. Most preferably, the hot plate 44 is heated to a temperature of about 120° C. FIG. 7 is a cross-sectional view of underfill 40, 42 having spread out to fill the spaces between the semiconductor dice 12 and the substrate 14. The hot plate 44 heats up the underfill beads 36, 38 to reduce their viscosities. The liquefied underfill beads 36, 38 then spread out in the spaces between each semiconductor die 12 and the substrate 14 and flow across the spaces from the edge of each semiconductor die 12 to an opposite edge thereof due to capillary action until such spaces around the solder joints 16 and between the semiconductor dice 12 and the substrate 14 are totally infused with underfill 40, 42. The flow of underfill material 30 across the spaces continues solely through capillary action until the spaces are totally infused with underfill 40, 42. Thus, other external forces, for instance a suction force to facilitate the flow of underfill material 30, are not required.

Finally, the underfill 40, 42 is cured, such as in a curing oven.

Using the above method according to the preferred embodiment of the invention, multiple semiconductor dice 12 can be processed simultaneously to introduce underfill material 30, with the result that throughput is significantly increased as compared to prior art approaches which introduce underfill material 30 to one semiconductor die 12 at a time. For a given size of a semiconductor die 12, size of solder joint 16 and standoff height between the semiconductor die 12 and the substrate 14, it would be appreciated that the size of the stencil opening 24, 26, and the thicknesses of the stencil 20 and the dry film 22 that are required can be estimated quite precisely. This assists in avoiding the wastage of underfill material 30.

Furthermore, the presence of the dry film 22 that is adhered underneath the stencil 20 serves to accurately maintain the gap 34 between the bottom surface of the stencil 20 and the top surface of the chip, so that the risk of the stencil 20 damaging the semiconductor die 12 during printing is much reduced.

The introduction of a heating apparatus to apply heat constantly onto the stencil 20, squeegee 28 and underfill material 30 also ensures that the underfill material 30 can be printed more easily and that the printed underfill beads 36, 38 next to one edge of each semiconductor die 12 are more uniform. Furthermore, lowering the viscosity of the underfill material 30 leaves less residue of underfill material 30 on the stencil 20 and improves its performance and effectiveness.

The invention described herein is susceptible to variations, modifications and/or additions other than those specifically described and it is to be understood that the invention includes all such variations, modifications and/or additions which fall within the spirit and scope of the above description.

The invention claimed is:

1. A method of feeding underfill material to fill a space between a semiconductor die and a substrate onto which the semiconductor die has been bonded, the method comprising the steps of:
   positioning a stencil over the semiconductor die, the stencil having an elongated slot extending adjacent to an edge of the semiconductor die beyond a surface area of the semiconductor die;
   printing the underfill material through the slot such that the underfill material falls through the slot onto the substrate next to the edge of the semiconductor die outside the surface area of the semiconductor die; and thereafter
   heating the underfill material such that the underfill material flows across the space between the semiconductor die and the substrate from the edge of the semiconductor die to an opposite edge thereof through capillary action.

2. The method as claimed in claim 1, wherein the step of heating the underfill material such that the underfill material flows across the space comprises the step of placing the substrate onto a hot plate.

3. The method as claimed in claim 2, wherein the hot plate has a temperature of more than 100° C.

4. The method as claimed in claim 2, further comprising the step of removing the stencil from the substrate prior to placing the substrate onto the hot plate.

5. The method as claimed in claim 1, wherein the flow of underfill material across the space continues solely through capillary action until the space is totally infused with the underfill material.

6. The method as claimed in claim 1, further comprising the step of controlling a volume of underfill material that is printed onto the substrate so that it is equal to the space between the semiconductor die, solder joints and the substrate, including fillet on four sides of the semiconductor die.

7. The method as claimed in claim 1, wherein the stencil further comprises multiple elongated slots and the stencil is placed over multiple semiconductor dice bonded onto the substrate to feed underfill material to all the multiple semiconductor dice.

8. The method as claimed in claim 1, wherein the step of printing the underfill material through the slot further comprises the step of pushing underfill material over a top surface of a stencil using a squeegee to provide the underfill material to the slot.

9. The method as claimed in claim 8, further comprising the step of heating the underfill material when pushing the underfill material with the squeegee to lower its viscosity when it is provided to the slot.

10. A method of feeding underfill material to fill a space between a semiconductor die and a substrate onto which the semiconductor die has been bonded, the method comprising the steps of:

positioning a stencil over the semiconductor die, the stencil having an elongated slot extending adjacent to an edge of the semiconductor die;

printing the underfill material through the slot such that the underfill material falls through the slot onto the substrate next to the edge of the semiconductor die; and thereafter heating the underfill material such that the underfill material flows across the space between the semiconductor die and the substrate from the edge of the semiconductor die to an opposite edge thereof through capillary action, wherein the stencil comprises an opening which is surrounded by an offset layer that is adhered to the stencil, each opening being sized to enclose one semiconductor die and is slightly larger than the semiconductor die.

11. The method as claimed in claim 10, wherein a surface of the offset layer rests on the substrate when printing the underfill material through the slot.

12. The method as claimed in claim 11, wherein the offset layer is formed with a sufficient thickness so as to leave a gap between the semiconductor die and the stencil when the offset layer is resting on the substrate.

13. The method as claimed in claim 10, wherein the offset layer comprises a layer of dry film.

14. A method of feeding underfill material to fill a space between a semiconductor die and a substrate onto which the semiconductor die has been bonded, the method comprising the steps of:

positioning a stencil over the semiconductor die, the stencil having an elongated slot extending adjacent to an edge of the semiconductor die;

printing the underfill material through the slot such that the underfill material falls through the slot onto the substrate next to the edge of the semiconductor die, wherein the step of printing the underfill material through the slot further comprises the step of pushing underfill material over a top surface of a stencil using a squeegee to provide the underfill material to the slot, and heating the underfill material when pushing the underfill material with the squeegee to lower its viscosity when it is provided to the slot; and thereafter heating the underfill material such that the underfill material flows across the space between the semiconductor die and the substrate from the edge of the semiconductor die to an opposite edge thereof through capillary action, wherein the step of heating the underfill material comprises the step of supplying hot air onto the underfill material in front of a pushing direction of the squeegee as the squeegee moves across the top surface of the stencil.

15. A method of feeding underfill material to fill spaces between a plurality of semiconductor dice and a substrate onto which the plurality of semiconductor dice have been bonded, the method comprising the steps of:

positioning a stencil over the semiconductor dice, the stencil having a plurality of elongated slots, each elongated slot extending adjacent to an edge and outside a perimeter of each one of the semiconductor dice;

printing the underfill material through the slots such that the underfill material falls through the slots onto the substrate next to the edges and outside the perimeters of the semiconductor dice; and thereafter heating the underfill material such that the underfill material flows across the spaces between the semiconductor dice and the substrate from the edge of each semiconductor die to an opposite edge thereof through capillary action.

16. A method of manufacturing an integrated circuit package, comprising the steps of:

bonding a semiconductor die onto a substrate;

positioning a stencil over the semiconductor die, the stencil having an elongated slot extending adjacent to an edge of the semiconductor die beyond a surface area of the semiconductor die;

printing the underfill material through the slot such that the underfill material falls through the slot onto the substrate next to the edge of the semiconductor die outside the surface area of the semiconductor die; and thereafter heating the underfill material such that the underfill material flows across a space between the semiconductor die and the substrate from the edge of the semiconductor die to an opposite edge thereof through capillary action to form an underfill.

* * * * *